United States Patent
Kim et al.

(10) Patent No.: US 7,335,455 B2
(45) Date of Patent: Feb. 26, 2008

(54) METHOD OF FORMING AN UNDERLAYER OF A BI-LAYER RESIST FILM AND METHOD OF FABRICATING A SEMICONDUCTOR DEVICE USING THE SAME

(75) Inventors: Hyun-Woo Kim, Suwon (KR); Jin Hong, Gyeonggi-do (KR); Myoung-Ho Jung, Yongin (KR); Sang-Gyun Woo, Yongin (KR)

(73) Assignee: Samsung Electronics Co. Ltd, Gyeonggi-Do (KR)

( * ) Notice: Subject to any disclaimer, the term of this patent is extended or adjusted under 35 U.S.C. 154(b) by 70 days.

(21) Appl. No.: 10/787,368

(22) Filed: Feb. 26, 2004

(65) Prior Publication Data

US 2004/0259024 A1    Dec. 23, 2004

(30) Foreign Application Priority Data

Jun. 23, 2003    (KR) ............... 10-2003-0040773

(51) Int. Cl.
G03F 7/00    (2006.01)
G03F 7/004    (2006.01)

(52) U.S. Cl. ................... 430/270.1; 430/273.1
(58) Field of Classification Search ............. 430/270.1, 430/273.1
See application file for complete search history.

(56) References Cited

U.S. PATENT DOCUMENTS

| | | | | |
|---|---|---|---|---|
| 4,276,136 | A | * | 6/1981 | Gruber et al. ................. 522/77 |
| 6,054,248 | A | * | 4/2000 | Foster et al. .............. 430/271.1 |
| 6,146,793 | A | * | 11/2000 | Schaedeli et al. .............. 430/18 |
| 6,165,682 | A | * | 12/2000 | Foster et al. .............. 430/270.1 |
| 6,261,687 | B1 | * | 7/2001 | Ryang et al. ................. 428/379 |
| 6,319,655 | B1 | * | 11/2001 | Wong et al. ................. 430/311 |
| 6,365,321 | B1 | * | 4/2002 | Chen et al. .............. 430/270.1 |
| 6,610,808 | B2 | * | 8/2003 | De et al. ..................... 526/281 |
| 2002/0086161 | A1 | * | 7/2002 | Smetana et al. ............. 428/413 |
| 2003/0069363 | A1 | * | 4/2003 | Greenblatt et al. ......... 525/274 |
| 2004/0009428 | A1 | * | 1/2004 | Tamura et al. ........... 430/280.1 |
| 2004/0048194 | A1 | * | 3/2004 | Breyta et al. ............. 430/271.1 |

* cited by examiner

Primary Examiner—Amanda Walke
(74) Attorney, Agent, or Firm—F. Chau & Associates, LLC.

(57) ABSTRACT

A method of forming an underlayer of a bi-layer resist including forming a blended material by blending a polymer having an aromatic group and a methacrylate polymer, and coating a substrate with the blended material. The blended material coated on the substrate is irradiated to form an underlayer. The polymer having the aromatic group may be a novolac polymer or a naphthalene polymer.

27 Claims, 3 Drawing Sheets

METHOD OF FORMING AN UNDERLAYER OF A BI-LAYER RESIST FILM AND METHOD OF FABRICATING A SEMICONDUCTOR DEVICE USING THE SAME

This U.S. non-provisional patent application claims priority under 35 U.S.C. § 119 based on Korean Patent Application No. 2003-0040773 filed on Jun. 23, 2003.

BACKGROUND

1. Technical Field

The present disclosure relates to a method of forming a resist film and, more particularly, to a method of forming an underlayer of a bi-layer resist (BLR) film.

2. Description of the Related Art

As integration of semiconductor devices increases, formation of finer patterns is required. Light having a shorter wavelength is used in photolithography processes to form the finer patterns. For example, as the integration in DRAMs increases to 1 Gbytes, a deep UV region having a wavelength of 193 nm is employed using an argon fluoride (ArF) excimer laser. Accordingly, a resist suitable for the deep UV region is required. A bi-layer resist that provides a large pattern aspect ratio as well as great depth of focus (DOF) margin and high resolution is currently being researched.

The bi-layer resist is composed of a thin toplayer containing Si functionality and a thick underlayer that is under the toplayer. A conventional process of patterning the bi-layer resist includes exposing and developing the toplayer to form the toplayer patterns and thereafter transferring the toplayer patterns to the underlayer using oxygen plasma etch. During the oxygen plasma etch process, the silicon contained in the patterned toplayer reacts to the oxygen, thereby forming silicon oxide. The patterned toplayer containing the silicon oxide acts as an etch mask in the process of transferring a pattern to the underlayer. This process results in a bi-layer having a large thickness, and a toplayer directly exposed to light having a relatively small thickness, which in turn allows for a large aspect ratio and a high resolution.

The toplayer applied in a bi-layer resist has been broadly studied, for example, in SPIE vol. 3999, p. 1171 (2000), SPIE vol. 2724, p. 344 (1996), SPIE vol. 3678 p. 214 (1999), SPIE vol. 3678, p. 420 (1999), J. Photopolym. Sci. Technol. vol. 10, p 585 (1997), but not the underlayer.

The underlayer is required to act as an anti-reflective layer (ARL) in the exposure process of the toplayer. To realize this, it is necessary for the underlayer to have a proper extinction coefficient (k). Secondly, the underlayer is required to have an excellent dry etch resistance during a pattern transfer process to a substrate. Thus, there is a need for an underlayer of a bi-layer resist that is optimized in terms of both extinction coefficient (k) and dry etch resistance.

SUMMARY OF THE INVENTION

A method of forming an underlayer of a bi-layer resist film according to an embodiment of the invention includes forming a blended material by blending a polymer having an aromatic group and a methacrylate polymer represented by the following chemical formula 1:

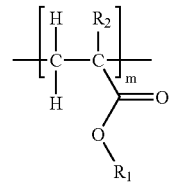
(Chemical Formula 1)

wherein, $R_1$ is one selected from a group consisting of an aromatic compound, a hydrocarbon of 1 to 10 carbon atoms, an aliphatic hydrocarbon of 1 to 15 carbon atoms, an alcohol of 1 to 15 carbon atoms, a lactone of 1 to 15 carbon atoms, an ether of 1 to 15 carbon atoms and a carboxylic acid of 1 to 15 carbon atoms, $R_2$ is a hydrogen or a methyl group, and m is an integer ranging from 10 to 500. A substrate is coated with the blended material, and the blended material coated on the substrate is irradiated.

Preferably, the polymer having an aromatic group is a novolac polymer or a naphthalene polymer. Preferably, in blending the novolac and methacrylate polymers, the methacrylate polymer is blended to about 20 to about 70 wt % of a sum of the weights of the novolac and methacrylate polymers. In blending the naphthalene and methacrylate polymers, the methacrylate polymer is preferably blended to about 20 to about 70 wt % of a sum of the weights of the naphthalene and methacrylate polymers.

The blended material may further include at least one selected from a group consisting of a thermal acid generator, a cross-linker and a surfactant.

Preferably, the blended material coated on the substrate is irradiated with UV rays or an e-beam. Preferably, the UV rays have a wavelength of about 150 nm to about 180 nm. More preferably, the UV rays have a wavelength of about 172 nm. Also, the UV rays preferably have energy of about 0.1 J/cm² to about 100 J/cm². The e-beam preferably has energy of about 0.1 mC/cm² to about 100 mC/cm².

Preferably, the irradiation of the blended material is performed at a temperature of about room temperature to about 100° C. The temperature can be adjusted using a hot plate or a halogen lamp.

A method of forming an underlayer of a bi-layer resist film according to another embodiment of the invention includes preparing a material including a copolymer having a monomer with an aromatic group and a methacrylate monomer, the copolymer represented by the following chemical formula 2:

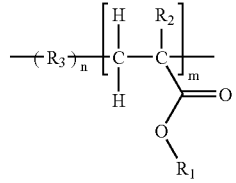
(Chemical Formula 2)

wherein, $R_1$ is one selected from a group consisting of an aromatic compound, a hydrocarbon of 1 to 10 carbon atoms, an aliphatic hydrocarbon of 1 to 15 carbon atoms, an alcohol of 1 to 15 carbon atoms, a lactone of 1 to 15 carbon atoms, an ether of 1 to 15 carbon atoms and a carboxylic acid of 1 to 15 carbon atoms, $R_2$ is a hydrogen or a methyl group, $R_3$ is a monomer having an aromatic group, and each of m and n is an integer ranging from 10 to 500. A substrate is coated with the prepared material, and the prepared material coated on the substrate is irradiated.

Preferably, the copolymer is a copolymer having styrene and methacrylate monomers, the copolymer represented by the following chemical formula 3.

(Chemical Formula 3)

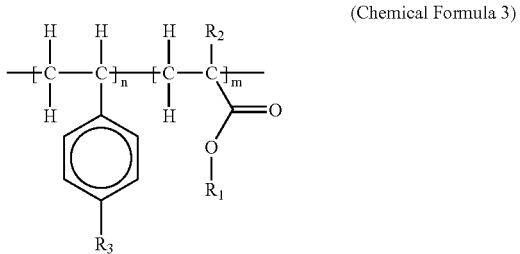

wherein, R1 is one selected from a group consisting of an aromatic compound, a hydrocarbon of 1 to 10 carbon atoms, an aliphatic hydrocarbon of 1 to 15 carbon atoms, an alcohol of 1 to 15 carbon atoms, a lactone of 1 to 15 carbon atoms, an ether of 1 to 15 carbon atoms and a carboxylic acid of 1 to 15 carbon atoms, R2 is a hydrogen or a methyl group, $R_3$ is one selected from a group consisting of a hydrogen, a hydroxyl group, a chlorine and a bromine, and each of m and n is an integer ranging from 10 to 500.

Preferably, the mole ratio m/(m+n) is about 0.3 to about 0.6.

Preferably, the material including the copolymer may further include at least one selected from a group consisting of a thermal acid generator, a cross-linker and a surfactant.

Preferably, the prepared material coated on the substrate is irradiated with UV rays or an e-beam. Preferably, the UV rays have a wavelength of about 150 nm to about 180 nm. More preferably, the UV rays have a wavelength of about 172 nm. Also, the UV rays preferably have energy of about 0.1 J/cm² to about 100 J/cm². The e-beam preferably has energy of about 0.1 mC/cm² to about 100 mC/cm².

Preferably, the irradiation of the prepared material is performed at a temperature of about room temperature to about 100° C. The temperature can be adjusted using a hot plate or a halogen lamp.

A method of forming a semiconductor device using a bi-layer resist according to an embodiment of the invention includes forming a blended material by blending a polymer having an aromatic group and a methacrylate polymer represented by the following chemical formula:

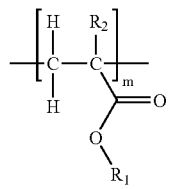

wherein, $R_1$ is one selected from a group consisting of an aromatic compound, a hydrocarbon of 1 to 10 carbon atoms, an aliphatic hydrocarbon of 1 to 15 carbon atoms, an alcohol of 1 to 15 carbon atoms, a lactone of 1 to 15 carbon atoms, an ether of 1 to 15 carbon atoms and a carboxylic acid of 1 to 15 carbon atoms, $R_2$ is a hydrogen or a methyl group, and m is an integer ranging from 10 to 500. A substrate is coated with the blended material. An underlayer is formed by irradiating the blended material coated on the substrate. A toplayer is formed over the underlayer, and a toplayer pattern is formed in the toplayer. An underlayer pattern is formed by etching the underlayer using the toplayer pattern as an etch mask, and the substrate is etched using the underlayer pattern as an etch mask.

A method of forming a semiconductor device using a bi-layer resist according to another embodiment of the invention includes preparing a material including a copolymer having a monomer with an aromatic group and a methacrylate monomer, the copolymer represented by the following chemical formula:

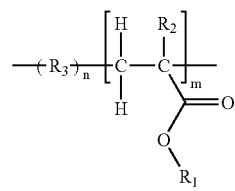

wherein, $R_1$ is one selected from a group consisting of an aromatic compound, a hydrocarbon of 1 to 10 carbon atoms, an aliphatic hydrocarbon of 1 to 15 carbon atoms, an alcohol of 1 to 15 carbon atoms, a lactone of 1 to 15 carbon atoms, an ether of 1 to 15 carbon atoms and a carboxylic acid of 1 to 15 carbon atoms, $R_2$ is a hydrogen or a methyl group, $R_3$ is a monomer having an aromatic group, and each of m and n is an integer ranging from 10 to 500. A substrate is coated with the prepared material. An underlayer is formed by irradiating the prepared material coated on the substrate. A toplayer is formed over the underlayer, and a toplayer pattern is formed in the toplayer. An underlayer pattern is formed by etching the underlayer using the toplayer pattern as an etch mask, and the substrate is etched using the underlayer pattern as an etch mask.

BRIEF DESCRIPTION OF THE DRAWINGS

The present invention will become readily apparent by describing preferred embodiments thereof in detail with reference to the accompanying drawings wherein.

DESCRIPTION OF PREFERRED EMBODIMENTS

Preferred embodiments of the present invention will be described in detail below with reference to the accompanying drawings. However, the present invention is not restricted by the embodiment described herein but can be embodied in other forms.

Figure 1:
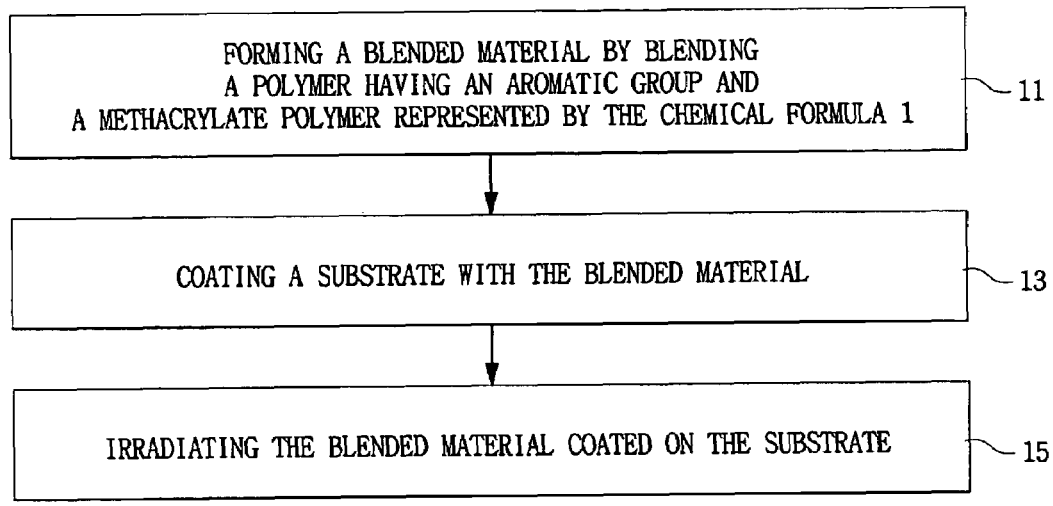
FIG. 1 is a flowchart for explaining a method of forming an underlayer of a bi-layer resist film according to an embodiment of the present invention.

FIG. 1 is a flowchart for explaining a method of forming an underlayer of a bi-layer resist film according to an embodiment of the present invention.

Referring to FIG. 1, the method of forming a underlayer according to the present embodiment includes forming a blended material by blending a polymer having an aromatic group and a methacrylate polymer represented by the following chemical formula 1 (step 11), coating a substrate with the blended material (step 13), and irradiating the blended material coated on the substrate(step 15).

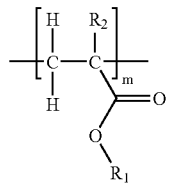

(Chemical Formula 1)

wherein, $R_1$ is one selected from a group consisting of an aromatic compound, a hydrocarbon of 1 to 10 carbon atoms, an aliphatic hydrocarbon of 1 to 15 carbon atoms, an alcohol of 1 to 15 carbon atoms, a lactone of 1 to 15 carbon atoms, an ether of 1 to 15 carbon atoms, and a carboxylic acid of 1 to 15 carbon atoms, $R_2$ is a hydrogen or a methyl group, and m is an integer ranging from 10 to 500.

The bi-layer resist film is composed of the underlayer and a toplayer on the underlayer. Generally, the underlayer is required to act as an anti-reflective layer (ARL) in the exposure process of the toplayer. Thus, it is necessary for the underlayer to have proper reflectance and extinction coefficient (k). Secondly, the underlayer is required to have an excellent dry etch resistance during a pattern transfer process to a substrate.

Figure 2:
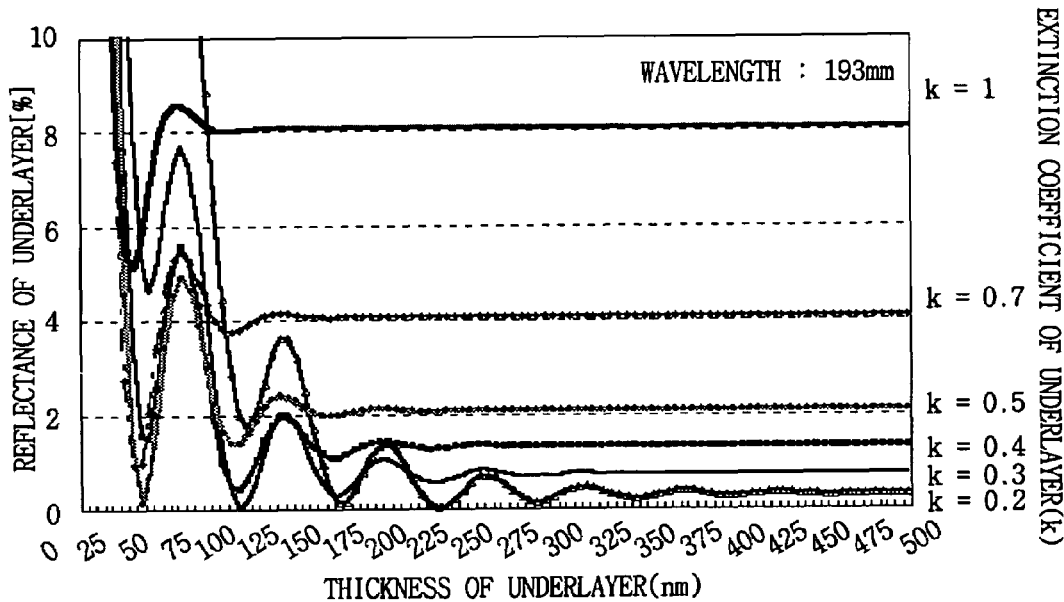
FIG. 2 is a graph showing reflectance of an underlayer in accordance with thickness and extinction coefficient (k) of the underlayer.

In a wavelength region of 193 nm, the underlayer preferably has a reflectance of 1% or less so as to act as an anti-reflective layer. If the reflectance of the underlayer exceeds 1%, an undercut in the toplayer is improperly generated during the exposure process of the toplayer. Referring to FIG. 2, when a thickness of the underlayer is over 200 nm, the extinction coefficient (k) of the underlayer is preferably 0.3 or less to obtain a reflectance of 1% or less.

The polymer having an aromatic group strongly absorbs light in a deep UV region, and thus on its own would provide an extinction coefficient (k) that is too large for the proper reflectance. On the other hand, the methacrylate polymer represented by the chemical formula 1 is transparent in the deep UV region and has a small extinction coefficient (k). Accordingly, to adjust the extinction coefficient (k) of the underlayer, in step 11, the polymer having the aromatic group and the methacrylate polymer represented by the chemical formula 1 is blended. The extinction coefficient (k) of the underlayer may be determined by weight percent of the methacrylate polymer relative to a sum of the weight of the polymer having the aromatic group and the weight of methacrylate polymer.

However, when the blended material is directly used as the underlayer, a disruption phenomenon of a resist pattern in a pattern transfer process onto the substrate may be generated since the methacrylate polymer has poor dry etch resistance. Accordingly, in step 15, the blended material is irradiated to increase the dry etch resistance. The irradiation causes a free radical reaction of the methacrylate polymer. At this time, carbonyl bond or carboxyl bond of the methacrylate polymer is dissolved by the irradiation and then the methacrylate polymer is cross-linked, thereby eliminating oxygen which is known to have an adverse affect on the dry etch resistance. As a result, carbon density in the underlayer is rapidly increased, thereby improving the dry etch resistance of the underlayer.

The polymer having an aromatic group is preferably a novolac polymer or a naphthalene polymer. Also, an average molecular weight of the methacrylate polymer represented by the chemical formula 1 is preferably about 800 to about 80,000.

When the methacrylate polymer is less than 20 wt % of the sum of the weights of the novolac and methacrylate polymers, the extinction coefficient (k) exceeds 0.3, and when the methacrylate polymer exceeds 70 wt %, the proper dry etch resistance is not achieved even if the blended material is irradiated. Accordingly, the methacrylate polymer is preferably blended to about 20 wt % to about 70 wt % of the sum of the weights of the novolac and methacrylate polymers.

In blending the naphthalene and methacrylate polymers, the methacrylate polymer is preferably blended to about 20 wt % to about 70 wt % of the sum of the weights of the naphthalene and methacrylate polymers. As in blending the novolac and methacrylate polymers, if the methacrylate polymer is less than 20 wt % of the sum of weights of the naphthalene and methacrylate polymers, the extinction coefficient (k) exceeds 0.3, and if the methacrylate polymer exceeds 70%, the proper dry etch resistance is not achieved even if the blended material is irradiated.

The blended material may further include at least one selected from the group consisting of a thermal acid generator, a cross-linker and a surfactant.

The irradiation of the blended material coated on the substrate may be performed with UV rays or an e-beam.

The UV rays preferably have a wavelength of about 150 nm to about 180 nm. Within this wavelength range, methacrylate polymer is adequately cross-linked by the free radical reaction. More preferably, the UV rays have a wavelength of about 172 nm. Additionally, the UV rays preferably have energy of about 0.1 J/cm² to about 100 J/cm². UV rays having energy of 0.1 J/cm² or more are suitable for initiating reaction, but energy exceeding 100 J/cm² causes problems related to throughput.

The e-beam preferably has energy of about 0.1 mC/cm² to about 100 mC/cm². An e-beam having energy of 0.1 mC/cm² or more is suitable for initiating reaction, but energy exceeding 100 mC/cm² causes problems related to throughput.

The irradiation is preferably performed within a temperature range of about room temp. to about 100° C. The temperature can be adjusted using a hot plate or a halogen lamp.

Figure 3:
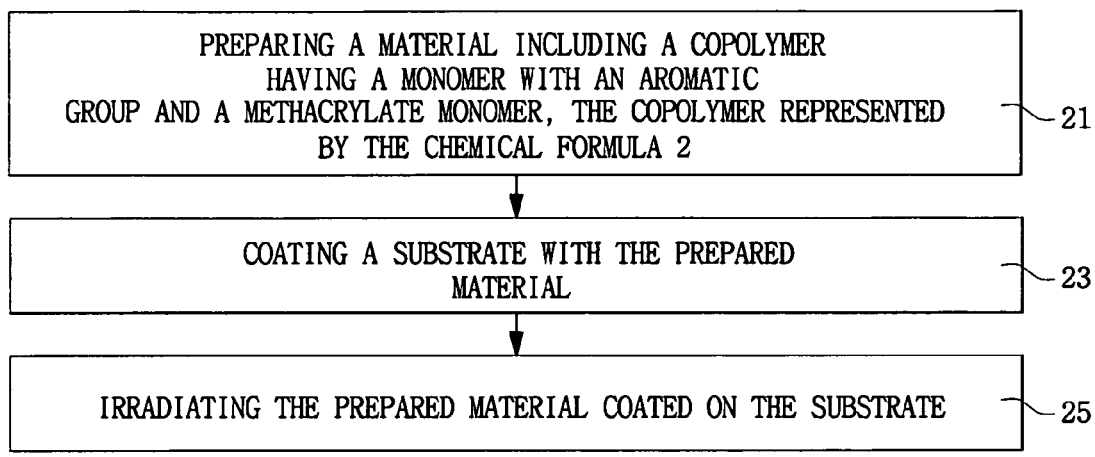
FIG. 3 is a flowchart for explaining a method of forming an underlayer of a bi-layer resist film according to another embodiment of the present invention.

FIG. 3 is a flowchart for explaining a method of forming an underlayer of a bi-layer resist film according to another embodiment of the present invention.

Referring to FIG. 3, the method of forming an underlayer according to the present embodiment includes preparing a material including a copolymer having a monomer with an aromatic group and methacrylate monomer, the copolymer represented by the following chemical formula 2 (step 21), coating a substrate with the prepared material including the copolymer (step 23) and irradiating the prepared material coated on the substrate (step 25).

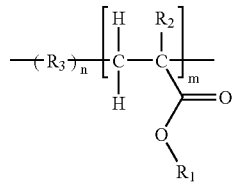

(Chemical Formula 2)

wherein, $R_1$ is one selected from the group consisting of an aromatic compound, a hydrocarbon of 1 to 10 carbon atoms, an aliphatic hydrocarbon of 1 to 15 carbon atoms, an alcohol of 1 to 15 carbon atoms, a lactone of 1 to 15 carbon atoms, an ether of 1 to 15 carbon atoms and a carboxylic acid of 1 to 15 carbon atoms, $R_2$ is a hydrogen or a methyl group, $R_3$ is a monomer having an aromatic group, and each of m and n is an integer ranging from 10 to 500.

The monomer having an aromatic group strongly absorbs light in the deep UV region, and thus on its own would provide a large extinction coefficient (k). On the other hand, the methacrylate monomer is transparent in the deep UV region and has a small extinction coefficient (k). Accordingly, in order to adjust the extinction coefficient (k) of the underlayer, a material including the copolymer represented by the chemical formula 2 is prepared (step 21). The extinction coefficient (k) of the underlayer may be determined by the mole ratio of the methacrylate monomer relative to a sum of moles of the monomer having an aromatic group and moles of the methacrylate monomer.

However, since the copolymer having the methacrylate monomer, represented by the chemical formula 2, has poor dry etch resistance, a disruption phenomenon of a resist pattern in a pattern transfer process onto the substrate can be generated when the copolymer is directly used as the underlayer. Accordingly, in step 23, the prepared material containing the copolymer is irradiated to increase the dry etch resistance. The irradiation causes a free radical reaction of the copolymer. At this time, a carbonyl bond or a carboxyl bond of the methacrylate monomer in the copolymer is dissolved by the irradiation and the copolymer is cross-linked, thereby eliminating oxygen which is known to have an adverse affect on the dry etch resistance. As a result, carbon density in the underlayer is rapidly increased, thereby improving dry etch resistance of the underlayer.

An average molecular weight of the copolymer represented by the chemical formula 2 is preferably about 1,000 to about 100,000.

The copolymer represented by the chemical formula 2 is preferably a copolymer having styrene and methacrylate monomers, i.e., a copolymer represented by the following chemical formula 3:

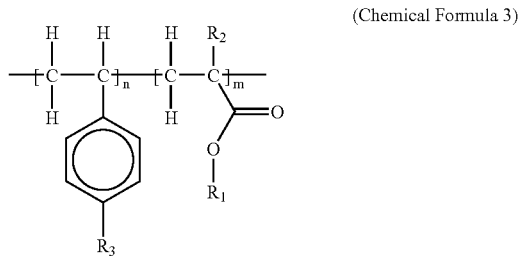

(Chemical Formula 3)

wherein, $R_1$ is one selected from the group consisting of an aromatic compound, a hydrocarbon of 1 to 10 carbon atoms, an aliphatic hydrocarbon of 1 to 15 carbon atoms, an alcohol of 1 to 15 carbon atoms, a lactone of 1 to 15 carbon atoms, an ether of 1 to 15 carbon atoms and a carboxylic acid of 1 to 15 carbon atoms, $R_2$ is a hydrogen or a methyl group, R3 is one selected form a group consisting of a hydrogen, a hydroxyl group, a chlorine and a bromine, and each of m and n is an integer ranging from 10 to 500.

The average molecular weight of the copolymer represented by the chemical formula 3 is preferably about 2,000 to about 100,000.

If the mole ratio m/(m+n) of the underlayer is less than 0.3, an extinction coefficient (k) of the underlayer exceeds 0.3. If the mole ratio m/(m+n) exceeds 0.6, desired dry etch resistance is not achieved even if the material including the copolymer represented by the chemical formula 3 is irradiated. Accordingly, the mole ratio m/(m+n) is preferably about 0.3 to about 0.6.

The material including the copolymer represented by the formula 2 may further include at least one selected from the group consisting of a thermal acid generator, a cross-linker, and a surfactant.

The irradiation of the prepared material coated on the substrate may be performed with UV rays or an e-beam.

The UV rays preferably have a wavelength in the range of about 150 to 180 nm. In this wavelength range, the copolymer represented by the chemical formula 2 is adequately cross-linked by the free radical reaction. More preferably, the UV rays have a wavelength of about 172 nm. Additionally, the UV rays preferably have energy of about 0.1 J/cm$^2$ to about 100 J/cm$^2$. UV rays having energy of 0.1 J/cm$^2$ or more are suitable for initiating reaction, but energy exceeding 100 J/cm$^2$ causes problems related to throughput.

The e-beam preferably has energy of about 0.1 mC/cm$^2$ to about 100 mC/cm$^2$. An e-beam having energy of 0.1 mC/cm$^2$ or more is suitable for initiating the, but energy of exceeding 100 mC/cm$^2$ causes problems related to throughput.

The irradiation is preferably performed at a temperature in the range of about room temp. to about 100° C. The temperature can be adjusted using a hot plate or a halogen lamp.

FIGS. 4a to 4d are sectional views showing a method of manufacturing a semiconductor device using an underlayer according to an embodiment of the present invention.

Figure 4A:
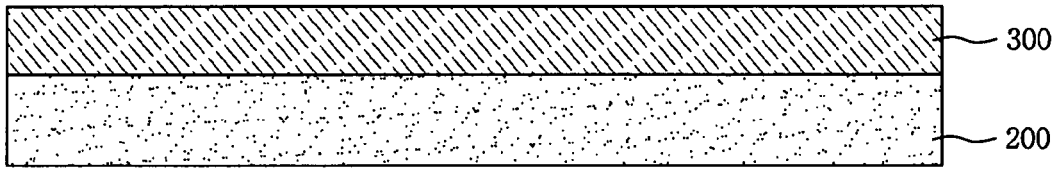
FIGS. 4a to 4d are sectional views showing a method of manufacturing a semiconductor device using an underlayer according to another embodiment of the present invention.

Referring to FIG. 4a, an underlayer material 300 is prepared and a substrate 200 is coated with the underlayer material 300. Generally, the substrate 200 may be a film that is typically applied during a semiconductor process, such as, for example, a silicon nitride film, a polysilicon film, a silicon oxide film or a metal film.

The underlayer material 300 may be a material including a polymer having an aromatic group blended with a methacrylate polymer represented by the chemical formula 1. Alternatively, the underlayer material 300 may be a material including a copolymer having a monomer with an aromatic group and a methacrylate monomer, i.e., copolymer represented by the chemical formula 2.

The polymer having an aromatic group is preferably a novolac polymer or a naphthalene polymer. In blending the novolac and the methacrylate polymers, the methacrylate polymer is preferably blended to about 20 wt % to about 70 wt % of the sum of the weights of the novolac and methacrylate polymers. In blending the naphthalene and the methacrylate polymers, the methacrylate polymer is preferably blended to about 20 wt % to about 70 wt % of the sum of the weights of the naphthalene and methacrylate polymers.

The copolymer represented by the chemical formula 2 is preferably a copolymer having styrene and methacrylate monomers, i.e., a copolymer represented by the chemical formula 3. The mole ratio m/(m+n) of the copolymer represented by the chemical formula 3 is preferably about 0.3 to about 0.6.

The underlayer material 300 may additionally include at least one selected from the group consisting of a thermal acid generator, a cross-linker and a surfactant.

The underlayer material 300 is preferably coated to a thickness of about 200 to about 1,000 nm. Further, the coating method may be a spin coating.

A first prebake is performed on the coated substrate 200 with the underlayer material 300. The first prebake is preferably performed at a temperature of about 100° C. to about 250° C.

Figure 4B:
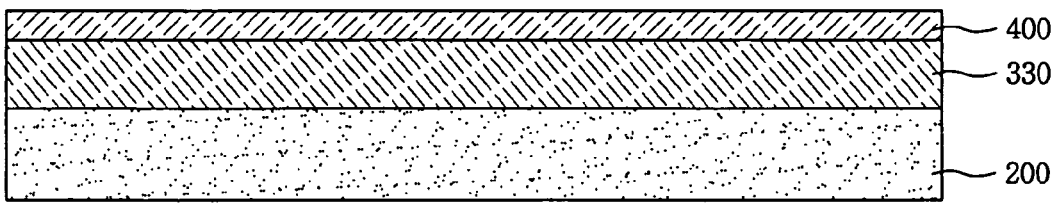

Referring to FIG. 4b, an underlayer 330 is formed by irradiating the underlayer material 300. The irradiation causes the free radical reaction of the methacrylate polymer or the copolymer represented by the chemical formula 2 in the underlayer material 300. At this time, a carbonyl bond or a carboxyl bond of the methacrylate polymer or the copolymer represented by the chemical formula 2 is dissolved by the irradiation and the methacrylate polymer or the copolymer represented by the chemical formula 2 is cross-linked, thereby eliminating oxygen which is known to have an adverse affect on the dry etch resistance. As a result, carbon density in the underlayer 330 is rapidly increased, and dry etch resistance of the underlayer is improved.

The irradiation of the underlayer material 300 may be performed with UV rays or an e-beam.

The UV rays preferably have a wavelength of about 150 nm to about 180 nm. In this wavelength range, the methacrylate polymer or the copolymer represented by the chemical formula 2 is adequately cross-linked by the free radical reaction. More preferably, the UV rays have a wavelength of about 172 nm. Additionally, the UV rays preferably have energy of about 0.1 J/cm$^2$ to about 100 J/cm$^2$. While UV rays having energy of 0.1 J/cm$^2$ or more are suitable for initiating reaction, energy exceeding 100 J/cm$^2$ causes problems related to throughput.

The e-beam preferably has energy of about 0.1 mC/cm$^2$ to about 100 mC/cm$^2$. While an e-beam having energy of 0.1 mC/cm$^2$ or more is suitable for initiating reaction, energy exceeding 100 mC/cm$^2$ causes problems related to throughput.

The irradiation of the beam is preferably performed at a temperature within a range of about room temp. to about 100° C. The temperature can be adjusted using a hot plate or a halogen lamp.

A toplayer 400 is formed on the underlayer 330. The toplayer 400 can be made of any suitable photosensitive material including silicon. Generally, if the toplayer 400 is a chemically amplified resist film including silicon, an intermixing problem may be caused between the top and underlayers. However, forming the underlayer 330 having the cross-linked polymers through irradiation reduces the intermixing problem.

A second prebake is performed on the substrate having the toplayer 400. The second prebake is preferably performed at a temperature of about 90° C. to about 150° C.

Figure 4C:
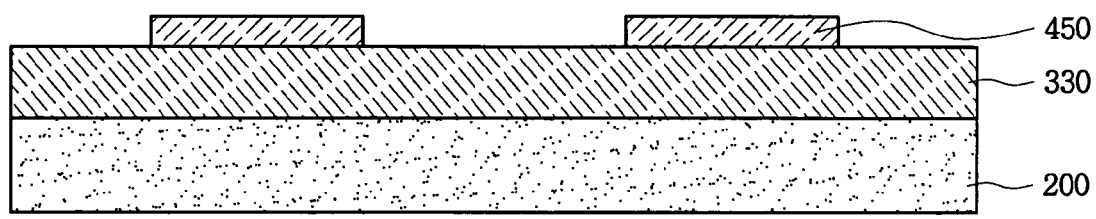

Referring to FIG. 4c, a toplayer pattern 450 is formed by exposing the toplayer 400 to radiation, post-exposure-baking (PEB) and developing the toplayer 400. At the same time, the underlayer 330 is exposed. A source of radiation may be one selected from ArF(193 nm), $F_2$(157 nm), an E-beam and an X-beam. Additionally, the toplayer pattern 450 may be any pattern, such as, for example, a line/space, a contact hole, an island, etc.

Figure 4D:
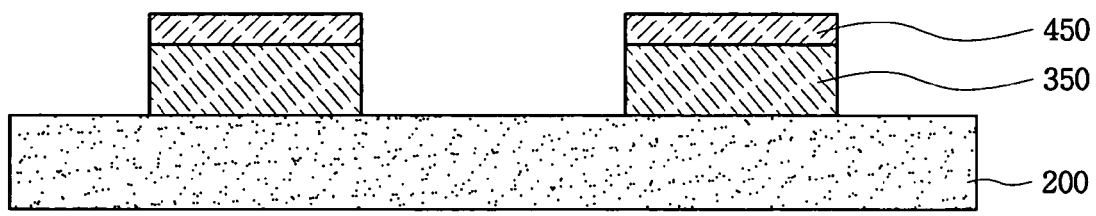

Referring to FIG. 4d, the underlayer pattern 350 is formed and the substrate 200 is exposed by dry developing the exposed underlayer 330 using oxygen plasma etch. The oxygen plasma etch is preferably an oxygen reactive ion etch (RIE). During the oxygen plasma etch, silicon in the toplayer pattern 450 is changed into silicon oxide (SiOx) and the toplayer pattern 450 containing the silicon oxide acts as an etch mask for the underlayer 330. The substrate 200 is etched using the underlayer pattern 350 as the etch mask, and the toplayer and underlayer patterns 450 and 350 are eliminated by ashing. The ashing may be oxygen ashing.

Hereinafter, examples are presented which are helpful in understanding the various exemplary embodiments of the present invention. The following examples only assist the understanding of the exemplary embodiments of the present invention, and are not meant to limit the present invention to any one embodiment.

The following Examples 1 to 5 and Comparative Examples 1 to 5 illustrate optimization of both extinction coefficient (k) and dry etch resistance of an underlayer of a bi-layer resist film according to embodiments of the present invention.

EXAMPLE 1

A underlayer material was prepared by blending a novolac polymer and a methacrylate polymer represented by the chemical formula 1, and in particular, by blending the methacrylate polymer to 20 wt % of the sum of weights of the novolac and methacrylate polymers. A silicon nitride substrate was coated with the underlayer material to a thickness of 200 nm, and the coated substrate was subjected to a first prebake at a temperature of 200° C. An underlayer was formed by irradiating the entire baked underlayer material with UV rays having a wavelength of 172 nm and energy of 10 J/cm2. Subsequently, a toplayer was formed on the underlayer using SBX 4102K(available from JSR Company) containing silicon, and the substrate having the toplayer was subjected to a second prebake at a temperature of 110° C. The baked toplayer was patterned by exposure to irradiation using an excimer laser having a wavelength of 193 nm, post-exposure-baking (PEB) and development, and thereafter, the toplayer pattern was transferred to the underlayer by an $O_2$ RIE to form an underlayer pattern. Then, the substrate was etched using the underlayer pattern as an etch mask, and thereafter the top and underlayer were eliminated by an oxygen ashing.

EXAMPLE 2

An experiment was performed in an identical manner to that in Example 1 except that the underlayer material was prepared by blending the methacrylate polymer to 30 wt % of the sum of the weights of the novolac and methacrylate polymers.

EXAMPLE 3

An experiment was performed in an identical manner to that in Example 1 except that the underlayer material was prepared by blending the methacrylate polymer to 40 wt % of the sum of the weights of the novolac and methacrylate polymers.

EXAMPLE 4

An experiment was performed in an identical manner to that in Example 1 except that the underlayer material was prepared by blending the methacrylate polymer to 50 wt % of the sum of the weights of the novolac and methacrylate polymers.

EXAMPLE 5

An experiment was performed in an identical manner to that in Example 1 except that the underlayer material was prepared by blending the methacrylate polymer to 70 wt % of the sum of the weights of the novolac and methacrylate polymers.

COMPARATIVE EXAMPLES 1 TO 5

In Comparative Examples 1 to 5, an experiment were performed in an identical manner to that in Examples 1 to 5 respectively with the exception of not irradiating the underlayer material with UV rays having a wavelength of 172 nm In each of the Examples 1 to 5 and the Comparative Examples 1 to 5, the substrate was coated with the underlayer material and thereafter, the extinction coefficient (k) of the underlayer material was measured in a wavelength region of 193 nm, and an etch rate of the underlayer was measured during the substrate etch process. The results are shown in Table 1. In Table 1, wt % of PMA represents wt % of the methacrylate polymer relative to the sum of the weights of the novolac and methacrylate polymers.

TABLE 1

| | | | Etch rate (Å/min) | |
|---|---|---|---|---|
| Item | Wt % of PMA | Extinction coefficient (k) | Example | Comparative Example |
| Example 1/ Comparative Example 1 | 20 | 0.3 | 500 | 650 |
| Example 2/ Comparative Example 2 | 30 | 0.27 | 520 | 670 |
| Example 3/ Comparative Example 3 | 40 | 0.23 | 530 | 690 |
| Example 4/ Comparative Example 4 | 50 | 0.21 | 560 | 700 |
| Example 5/ Comparative Example 5 | 70 | 0.1 | 600 | 800 |

From Table 1, it is seen that wt % of the methacrylate polymer relative to the sum of the weights of the novolac and methacrylate polymers should be 20 wt % or more to obtain an extinction coefficient (k) of 0.3 or less in the wavelength region of 193 nm. Additionally, it is seen that the methacrylate polymer should be 70 wt % or less in order to obtain an etch rate of 600 Å/min or less, which is a proper etch rate at which there is no pattern disruption phenomenon in the underlayer during the substrate etch process. Accordingly, the methacrylate polymer is preferably present in an amount of about 20 to about 70 wt % of the sum of the weights of the novolac and methacrylate polymers. Additionally, it is seen that the etch rate of the underlayer in Examples 1-5 in which the underlayer material was irradiated with UV rays having a wavelength of 172 nm is about 25% slower relative to the etch rate in Comparative Examples 1-5 in which the underlayer material was not irradiated with UV rays.

The following Examples 6 to 9 and Comparative Examples 6 to 9 illustrate optimization of both the extinction coefficient (k) and the dry etch resistance of an underlayer of a bi-layer resist film according to another embodiment of the present invention.

EXAMPLE 6

A copolymer having a mole ratio m/(m+n) of 0.3 and represented by the chemical formula 3 was prepared as the under layer material. A silicon nitride substrate was coated with the underlayer material to a thickness of 200 nm, and the coated substrate was subjected to a first prebake at a temperature of 150° C. An underlayer was formed by irradiating the prebaked underlayer material with UV rays having a wavelength of 172 nm and energy of 5 J/cm². Subsequently, a toplayer was formed on the underlayer using SBX 4102K (available from JSR Company) including silicon, and the substrate having the toplayer was subjected to a second prebake at a temperature of 110° C. The baked toplayer was patterned by exposure to irradiation with an excimer laser having a wavelength of 193 nm, post-exposure-baking (PEB) and development, and thereafter, the pattern of the toplayer was transferred to the underlayer using an $O_2$ RIE. Subsequently, the substrate was etched using the underlayer as a mask, and the top and the underlayer were eliminated by an oxygen ashing.

EXAMPLE 7

An experiment was performed in an identical manner to that in Example 6 except that a copolymer having a mole ratio m/(m+n) of 0.4 was prepared as the underlayer material.

EXAMPLE 8

An experiment was performed in an identical manner to that in Example 6 except that a copolymer having a mole ratio m/(m+n) of 0.5 was prepared as the underlayer material.

EXAMPLE 9

An experiment was performed in an identical manner to that in Example 6 except that a copolymer having a mole ratio m/(m+n) of 0.6 was prepared as the underlayer material.

COMPARATIVE EXAMPLES 6 TO 9

In Comparative Examples 6 to 9, experiments were performed in an identical manner to that in Examples 6 to 9 respectively except that the underlayer material was not irradiated with UV rays having a wavelength of 172 nm.

In each of the Examples 6 to 9 and the Comparative Examples 6 to 9, the substrate was coated with the underlayer material and thereafter, the extinction coefficient (k) of the underlayer material was measured in a wavelength region of 193 nm, and an etch rate of the underlayer was measured during the substrate etch process. The results are shown in Table 2.

TABLE 2

| | | | Etch rate (Å/min) | |
|---|---|---|---|---|
| Item | m/(m + n) | Extinction coefficient (k) | Example | Comparative Example |
| Example 6/ Comparative Example 6 | 0.3 | 0.31 | 510 | 630 |
| Example 7/ Comparative Example 7 | 0.4 | 0.22 | 530 | 660 |

TABLE 2-continued

| Item | m/(m + n) | Extinction coefficient (k) | Etch rate (Å/min) Example | Etch rate (Å/min) Comparative Example |
|---|---|---|---|---|
| Example 8/ Comparative Example 8 | 0.5 | 0.15 | 560 | 750 |
| Example 9/ Comparative Example 9 | 0.6 | 0.11 | 580 | 780 |

From Table 2, it is seen that the mole ratio m/(m+n) should be 0.3 or more to obtain an extinction coefficient (k) of 0.3 or less in a wavelength region of 193 nm. Additionally, it is seen that the mole ratio m/(m+n) should be 0.6 or less to obtain an etch rate of 600 Å/min or less during the substrate etch process. An etch rate of 600 Å/min or less is a proper etch rate at which there is no pattern disruption phenomenon in the underlayer during the substrate etch process. Accordingly, the mole ratio m/(m+n) is preferably in the range of about 0.3 to 0.6.

Additionally, it is seen from Table 2 that the etch rate of the underlayer Examples 6-9 in which the underlayer material was irradiated with UV rays having a wavelength of 172 nm is about 20 to about 25% slower relative to the etch rate in Comparative Examples 6-9 in which the underlayer material was not irradiated. Thus, the dry etch resistance of the underlayer in Examples 6-9 is increased compared to that of Comparative Examples 6-9.

As described above, according to various exemplary embodiments of the present invention, it is possible to obtain a proper extinction coefficient (k) in an underlayer by blending a polymer having an aromatic group and a methacrylate polymer represented by the chemical formula 1, or by applying a material including a copolymer having a monomer with an aromatic group and a methacrylate monomer, i.e., a copolymer represented by the chemical formula 2. Furthermore, it is possible to increase the dry etch resistance by irradiating the blended material or the material including the copolymer material. As a result, an underlayer can be obtained which has a proper extinction coefficient (k) and an increased dry etch resistance.

While the present invention has been described in detail with reference to the preferred embodiments, it is to be understood that the invention is not limited to the disclosed embodiments, but, on the contrary, is intended to cover various modifications and equivalent arrangements included within the sprit and scope of the appended claims.

What is claimed is:

1. A method of forming an underlayer of a bi-layer resist film, comprising:

forming a blended material by blending a polymer having an aromatic group and a methacrylate polymer represented by the following chemical formula:

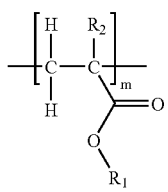

wherein, $R_1$ is one selected from a group consisting of an aromatic compound, a hydrocarbon of 1 to 5 carbon atoms, an aliphatic hydrocarbon of 1 to 15 carbon atoms, a lactone of 1 to 15 carbon atoms, an ether of 1 to 15 carbon atoms and a carboxylic acid of 1 to 15 carbon atoms, $R_2$ is a hydrogen or a methyl group, and m is an integer ranging from 10 to 500;

coating a substrate with the blended material; and irradiating the blended material coated on the substrate with an e-beam to form said underlayer, and wherein the polymer having the aromatic group is a novolac polymer or a naphthalene polymer.

2. The method according to claim 1, wherein the methacrylate polymer is blended to 20 to 70 wt % of a sum of weights of the novolac and the methacrylate polymers.

3. The method according to claim 1, wherein the methacrylate polymer is blended to 20 to 70 wt % of a sum of weights of the naphthalene and the methacrylate polymers.

4. The method according to claim 1, wherein the blended material further includes:

at least one selected from a group consisting of a thermal acid generator, a cross-linker and a surfactant.

5. The method according to claim 1, wherein the e-beam has energy of about 0.1 mC/cm² to about 100 mC/cm².

6. The method according to claims 1, wherein the coated substrate is irradiated at a temperature of about room temperature to about 100° C.

7. The method according to claim 6, wherein the temperature at which the coated substrate is irradiated is adjusted using a hot plate or a halogen lamp.

8. A method of forming a underlayer of a bi-layer resist film, comprising:

preparing a material including a copolymer having a monomer with an aromatic group and a methacrylate monomer, the copolymer represented by the following chemical formula:

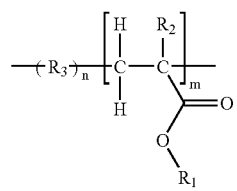

wherein, $R_1$ is one selected from a group consisting of an aromatic compound, a hydrocarbon of 1 to 5 carbon atoms, an aliphatic hydrocarbon of 1 to 15 carbon atoms, a lactone of 1 to 15 carbon atoms, an ether of 1 to 15 carbon atoms and a carboxylic acid of 1 to 15 carbon atoms, $R_2$ is a hydrogen or a methyl group, $R_3$ is a monomer having an aromatic group, and each of m and n is an integer ranging from 10 to 500;

coating a substrate with the prepared material; and irradiating the prepared material coated on the substrate with an e-beam to form said underlayer and, wherein the copolymer is a copolymer having styrene and methacrylate monomers.

9. The method according to claim 8, wherein the copolymer having the styrene and the methacrylate monomers is represented by the following chemical formula:

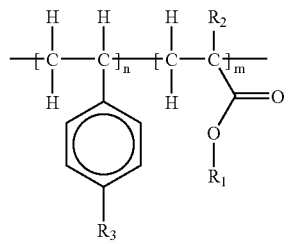

wherein, R1 is one selected from a group consisting of an aromatic compound, a hydrocarbon of 1 to 5 carbon atoms, an aliphatic hydrocarbon of 1 to 15 carbon atoms, a lactone of 1 to 15 carbon atoms, an ether of 1 to 15 carbon atoms and a carboxylic acid of 1 to 15 carbon atoms, R2 is a hydrogen or a methyl group, $R_3$ is one selected from a group consisting of hydrogen, a hydroxyl group, a chlorine and a bromine, and each of m and n is an integer ranging from 10 to 500.

10. The method according to claim 9, wherein the mole ratio m/(m+n) is about 0.3 to about 0.6.

11. The method according to claim 8, wherein the material including the copolymer further includes:
at least one selected from a group consisting of a thermal acid generator, a cross-linker and a surfactant.

12. The method according to claim 8, wherein the e-beam has energy of about 0.1 mC/cm$^2$ to about 100 mC/cm$^2$.

13. The method according to claim 8, wherein the irradiation of coated substrate is performed at a temperature of about room temp. to about 100° C.

14. The method according to claim 13, wherein the temperature at which the coated substrate is irradiated is adjusted using a hot plate or a halogen lamp.

15. A method of forming a semiconductor device using a bi-layer resist, comprising;
forming a blended material by blending a polymer having an aromatic group and a methacrylate polymer represented by the following chemical formula:

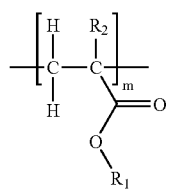

wherein $R_1$ is one selected from a group consisting of an aromatic compound, a hydrocarbon of 1 to 5 carbon atoms, an aliphatic hydrocarbon of 1 to 15 carbon atoms, a lactone of 1 to 15 carbon atoms, an ether of 1 to 15 carbon atoms and a carboxylic acid of 1 to 15 carbon atoms, $R_2$ is a hydrogen or a methyl group, and m is an integer ranging from 10 to 500;
coating a substrate with the blended material;
forming an underlayer by irradiating the blended material coated on the substrate with an e-beam;
forming a toplayer over the underlayer;
forming a toplayer pattern in the toplayer;
forming an underlayer pattern by etching the underlayer using the toplayer pattern as an etch mask; and
etching the substrate using the underlayer pattern as an etch mask, and wherein the polymer having the aromatic group is a novolac polymer or a naphthalene polymer.

16. The method of claim 15, further comprising:
performing a first prebake after coating the substrate with the blended material.

17. The method of claim 16, further comprising:
performing a second prebake after forming a toplayer over the underlayer.

18. The method of claim 15, further comprising:
removing the toplayer and the underlayer after etching the substrate.

19. The method of claim 18, wherein the toplayer and the underlayer are removed by ashing.

20. A method of forming a semiconductor device using a bi-layer resist, comprising:
preparing a material including a copolymer having a monomer with an aromatic group and a methacrylate monomer, the copolymer represented by the following chemical formula:

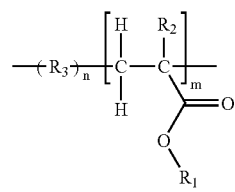

wherein, $R_1$ is one selected from a group consisting of an aromatic compound, a hydrocarbon of 1 to 5 carbon atoms, an aliphatic hydrocarbon of 1 to 15 carbon atoms, a lactone of 1 to 15 carbon atoms, an ether of 1 to 15 carbon atoms and a carboxylic acid of 1 to 15 carbon atoms, $R_2$ is a hydrogen or a methyl group) $R_3$ is a monomer having an aromatic group, and each of m and n is an integer ranging from 10 to 500;
coating a substrate with the prepared material;
forming an underlayer by irradiating the prepared material coated on the substrate with an e-beam
forming a toplayer over the underlayer;
forming a toplayer pattern in the toplayer;
forming an underlayer pattern by etching the underlayer using the toplayer pattern as an etch mask; and
etching the substrate using the underlayer pattern as an etch mask and, wherein the copolymer is a copolymer having styrene and methacrylate monomers, the copolymer is represented by the following chemical formula:

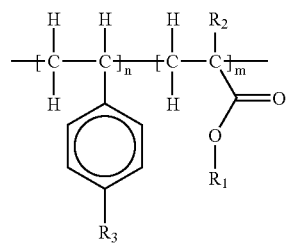

wherein, R1 is one selected from a group consisting of an aromatic compound, a hydrocarbon of 1 to 5 carbon atoms, an aliphatic hydrocarbon of 1 to 15 carbon atoms, a lactone of 1 to 15 carbon atoms, an ether of 1 to 15 carbon atoms and a carboxylic acid of 1 to 15 carbon atom, R2 is a hydrogen or a methyl group R$_3$ is one selected from a group consisting of hydrogen, a hydroxyl group, a chlorine and a bromine, and each of m and n is an integer ranging from 10 to 500.

21. The method of claim 20, further comprising:

performing a first prebake after coating the substrate with the prepared material.

22. The method of claim 21, further comprising:

performing a second prebake after forming a toplayer over the underlayer.

23. The method of claim 20, further comprising:

removing the toplayer and the underlayer after etching the substrate.

24. The method of claim 23, wherein the toplayer and the underlayer are removed by ashing.

25. A method of forming an underlayer of a bi-layer resist film, comprising:

forming a blended material by blending a polymer having an aromatic group and a methacrylate polymer represented by the following chemical formula:

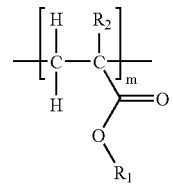

wherein, $R_1$ is one selected from a group consisting of an aromatic compound, a hydrocarbon of 1 to 5 carbon atoms, an aliphatic hydrocarbon of 1 to 15 carbon atoms, a lactone of 1 to 15 carbon atoms, an ether of 1 to 15 carbon atoms and a carboxylic acid of 1 to 15 carbon atoms, $R_2$ is a hydrogen or a methyl group, and m is an integer ranging from 10 to 500 coating a substrate with the blended material; and irrafiating said blended material on the substrate with an e-beam to cause a cross-linking reaction wherein the methacrylate polymer of the blending material becomes cross-linked, thereby forming said underlayer.

26. The method of claim 1, wherein the polymer having an aromatic group is a naphthalene polymer.

27. The method of claim 1, wherein the polymer having an aromatic group is a novolac polymer.

* * * * *